United States Patent
Deane

(10) Patent No.: US 8,067,277 B2
(45) Date of Patent: Nov. 29, 2011

(54) ACTIVE MATRIX DEVICE WITH PHOTO SENSOR

(75) Inventor: Steven C. Deane, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 374 days.

(21) Appl. No.: 12/391,334

(22) Filed: Feb. 24, 2009

(65) Prior Publication Data

US 2009/0162961 A1    Jun. 25, 2009

Related U.S. Application Data

(62) Division of application No. 10/596,380, filed on Jun. 12, 2006, now Pat. No. 7,514,762.

(30) Foreign Application Priority Data

Dec. 15, 2003  (GB) .................................. 0329002.0
Dec. 2, 2004   (GB) .................................. 0426413.1

(51) Int. Cl.
*H01L 21/00*    (2006.01)
*H01L 21/84*    (2006.01)

(52) U.S. Cl. ........ 438/149; 438/491; 438/510; 438/608; 257/E21.051; 257/E21.053; 257/E21.351; 257/E21.352; 257/E27.11

(58) Field of Classification Search .................. 438/149, 438/86, 97, 491, 495, 510, 608, 688; 257/E21.051, 257/53, 351, 352, 411

See application file for complete search history.

(56) References Cited

U.S. PATENT DOCUMENTS

| | | | |
|---|---|---|---|
| 4,769,686 A | 9/1988 | Horiuchi et al. | |
| 4,862,237 A | 8/1989 | Morozumi | |
| 4,894,699 A | 1/1990 | Hayashi et al. | |
| 5,262,649 A | 11/1993 | Antonuk | |
| 5,275,851 A | 1/1994 | Fonash et al. | |
| 5,426,064 A | 6/1995 | Zhang et al. | |
| 5,488,000 A | 1/1996 | Zhang et al. | |
| 5,589,694 A | 12/1996 | Takayama et al. | |
| 7,514,762 B2 * | 4/2009 | Deane ........................ | 257/538 |
| 2001/0052597 A1 | 12/2001 | Young | |
| 2006/0030084 A1 * | 2/2006 | Young ........................ | 438/149 |

FOREIGN PATENT DOCUMENTS

| | | |
|---|---|---|
| EP | 0634800 A1 | 1/1995 |
| WO | 0120591 A1 | 3/2001 |
| WO | 2004019123 A1 | 3/2004 |

* cited by examiner

*Primary Examiner* — David Nhu

(57) ABSTRACT

An active matrix pixel device is provided, for example an electroluminescent display device, the device comprising circuitry supported by a substrate and including a polysilicon TFT (10) and an amorphous silicon thin film PIN diode (12). Polysilicon islands are formed before an amorphous silicon layer is deposited for the PIN diode. This avoids the exposure of the amorphous silicon to high temperature processing. The TFT comprises doped source/drain regions (16a,17a), one of which (17a) may also provide the n-type or p-type doped region for the diode. Advantageously, the requirement to provide a separate doped region for the photodiode is removed, thereby saving processing costs. A second TFT (10b) having a doped source/drain region (16b,17b) of the opposite conductivity type may provide the other doped region (16b) for the diode, wherein the intrinsic region (25) is disposed laterally between the two TFTs, overlying each of the respective polysilicon islands.

4 Claims, 3 Drawing Sheets

ACTIVE MATRIX DEVICE WITH PHOTO SENSOR

This application is a division of Ser. No. 10/596,380 filed Jun. 12, 2006, now U.S. Pat. No. 7,514,762.

This invention relates to active matrix pixel devices such as active matrix electroluminescent displays which incorporate photo sensors in the pixel circuits thereof. Also the invention relates to the manufacture of such devices and particularly, but not exclusively, active matrix pixel devices which comprise thin film transistors having a polycrystalline silicon channel.

Active matrix electroluminescent display devices which employ light emitting display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer.

An active matrix electroluminescent display device generally comprises a row and column array of pixels. The supply of current to the display element of each pixel is controlled by a respective pixel circuit which typically comprises thin film transistors (TFTs). At least one of the TFTs, often referred to as the drive transistor, in each pixel circuit is employed to regulate the flow of current through the display element. It is important that the electrical characteristics of the drive transistor are stable throughout the operation of the display. TFTs having an amorphous silicon channel are known to suffer from problems such as threshold voltage drift when used to control continuous currents. For this reason, TFTs having a polycrystalline silicon (polysilicon) channel are favoured over amorphous silicon TFTs for use as the drive transistor. However, structural differences in polysilicon channels from one TFT to another can lead to differences in their electrical characteristics.

In addition to the problems associated with non-uniformity of polysilicon TFT characteristics, electroluminescent display elements are known to suffer from aging effects. For example, "burn-in" is caused by the prolonged operation of particular pixels in the array and results in non-uniform output intensities between pixels despite being driven with the same signals.

In order to correct for non-uniformities in the pixel outputs it is known to incorporate a photo sensor in each of the individual pixel circuits. Each photo sensor serves to measure the light output from its respective pixel and is connected in the pixel circuit in such a way as to compensate for the non-uniformity problems described above. Examples of such are known from WO-01/20591, which contents are incorporated herein by way of reference. FIG. 1 shows an example pixel circuit which employs an optical feedback mechanism as described. It will be appreciated that the pixel circuit is one of many hundreds within an array of similar circuits. Each pixel is defined at the crossing point of one of a set of data conductors 2 and one of a set of select conductors 4. Each of the sets of conductors 2, 4 run across the supporting substrate in a substantially orthogonal direction to one another. Power line 6 provides a current to the electroluminescent display element 8, the current being modulated by the drive transistor 10. The pixel circuit further comprises a photo sensor 12 which measures, or detects, the light output from the display element 8 and serves to modulate, or adjust, the current flowing through the drive transistor 10 in accordance with the measured light intensity.

Photo sensors, for example PIN diodes, formed of amorphous silicon are preferred over those formed of polysilicon because the optical absorption of amorphous silicon is several orders of magnitude higher over parts of the visible light range. An amorphous silicon photo sensor therefore provides a much higher signal to noise ratio in the associated correction circuitry.

For the reasons described above, each pixel circuit in a high quality active matrix electroluminescent display device preferably comprises polysilicon TFTs and amorphous silicon photo sensors. FIG. 2 shows a sectional view of part of the pixel circuit shown in FIG. 1 taken through the TFT 10 and the photo sensor 12. The TFT 10 shown is a top-gate type having a polysilicon channel 15 with adjacent doped polysilicon source and drain regions, 16 and 17. These regions may be doped either n-type or p-type. However, both n-type and p-type TFTs are often formed on the same substrate. A gate insulating layer 18 separates the channel 15 from a metallic gate 20.

When patterning the gate 20, a photo sensor contact 22 is also defined using the same metal layer. An n-i-p stack is then formed on the photo sensor contact 22 to provide a vertical amorphous silicon PIN diode 12. This stack comprises a layer of n-type amorphous silicon 24, a thicker layer of intrinsic amorphous silicon 25, and a layer of p-type amorphous silicon 26. These layers are deposited sequentially and then patterned into an island.

A top diode contact 28 is then formed of a transparent conductive material such as indium tin oxide (ITO) over the amorphous silicon stack. This allows light 100 from the overlying electroluminescent display element (not shown) to pass to the intrinsic silicon of the photo sensor.

One significant problem associated with the formation of the n-i-p stack is the difficulty in doping the p-type layer 26 during the deposition process. The doping is commonly carried out by gas phase doping. Dedicated equipment and gases are required in order to perform gas phase doping to avoid the undesirable contamination of the deposition chamber. Also, the gases required, $B_2H_6$ for example, are classed as particularly hazardous to work with and there is increasing pressure to remove such gases from the workplace due to health and safety concerns. This presents a significant barrier to large-scale manufacture of active matrix electroluminescent display devices having amorphous silicon photo sensors with polysilicon TFTs.

U.S. Pat. No. 5,589,694 discloses a semiconductor device in which TFTs and thin film diodes (TFDs) are formed on a substrate. A semiconductor layer is deposited and patterned to provide separate semiconductor islands for each of the TFTs and the TFDs. Plasma doping is employed to dope n-type and p-type regions in both the TFT and TFD islands, the latter being formed with a planar structure. One problem associated with forming a TFD in this way, is that the amorphous silicon intrinsic region of the diode must withstand the high temperatures associated with the processing of the polysilicon TFT island. It is difficult to protect the amorphous silicon from heat damage when it is in close proximity to the transistor stack which is to be heated. Another problem with the arrangement of U.S. Pat. No. 5,589,694 is that a series of separate islands must be defined for the respective transistors and diodes.

According to one aspect of the present invention there is provided a method of manufacturing an active matrix pixel device comprising a thin film transistor which includes a polycrystalline silicon channel and doped source/drain regions, and a PIN diode which includes a p-type doped region and an n-type doped region separated by an amorphous silicon intrinsic region, the method including the steps of:

(a) - forming a plurality of polycrystalline silicon islands on a substrate, one of which providing the transistor channel, and source/drain regions; and then, (b) - depositing and patterning a layer of amorphous silicon to provide the intrinsic region of the PIN diode such that the intrinsic region overlies and contacts at least a part of one of the polycrystalline silicon islands which provides one of the p-type or n-type doped regions. By depositing the amorphous silicon after the polysilicon islands have been processed, the amorphous silicon is not subjected to damaging heat treatment, thereby enabling a higher quality PIN diode to be manufactured.

Preferably, the source/drain regions and said one of the p-type or n-type doped regions of the PIN diode are provided by the same polycrystalline silicon island. Advantageously, this avoids the need for a separate doped contact to be formed, thereby reducing the number of processing steps, and saving production costs.

According to a second aspect of the invention there is provided an active matrix pixel device comprising a plurality of polycrystalline silicon islands supported by a substrate, one of the islands providing a channel and doped source/drain regions of a thin film transistor, the device further comprising a PIN diode which includes a p-type doped region and an n-type doped region separated by an amorphous silicon intrinsic region, wherein the intrinsic region overlies and contacts at least a part of one of the polycrystalline silicon islands which provides one of the p-type or n-type doped regions. The amorphous silicon intrinsic region of the PIN diode overlies the doped n-type and p-type regions to provide a contact therewith. This allows the polysilicon doped regions to be processed before the deposition of the amorphous silicon.

In one preferred embodiment of the invention the PIN diode has a lateral structure wherein both the p-type and n-type doped regions of the PIN diode are provided by respective ones of the polycrystalline silicon islands. These islands can be shared with transistors such that one, or both of the doped PIN diode regions share a polysilicon island with the source/drain regions of the transistors. Advantageously, doped regions from both p-type and n-type thin film transistors can be exploited to provide both doped regions of the PIN diode, thereby further reducing the number of process steps. It is common for both n-type and p-type thin film transistors to be present on one substrate. Therefore, very few extra processing steps are required in order to achieve a thin film PIN photodiode. In addition, a transparent conductive gate may be provided, the gate overlying the intrinsic region of the pin diode separated therefrom by an insulating layer. Advantageously, the gate serves to apply a voltage to the intrinsic region of the PIN photodiode so as to control the conductivity between the n-type and the p-type doped regions, in effect providing a gated PIN diode.

In another preferred embodiment of the invention, the PIN photodiode has a vertical structure in which the n-type, amorphous intrinsic silicon, and p-type layers are laminated wherein one of the doped contacts is provided by one of the polysilicon islands formed on the substrate. For example, the source/drain regions of a transistor are doped n-type, and the method of manufacture further comprises the steps of:

(c) - depositing and patterning a layer of aluminium to define a top PIN diode contact on the intrinsic region of the PIN diode;

(d) - annealing the top PIN diode contact to cause aluminium ions to diffuse into the underlying intrinsic region to form the p-type doped region. By employing aluminium as a dopant source, the need to use gas-phase doping in such a vertical structure in order to provide a p-doped contact is removed. Advantageously, this avoids the hazards associated with using gas-phase doping, thereby making this process of forming the p-type region both cheaper and safer then known methods.

In order to allow light from a display element, for example, to reach the intrinsic portion of the diode, a part of the top photodiode contact may be etched away using known etching techniques.

An example application of the active matrix pixel device according to the invention is an active matrix electroluminescent display device employing optical feedback in which the photodiode serves to measure the light intensity output from an associated display element and supply a signal to drive circuitry connected thereto to enable modulation of the light output in accordance with the measured light intensity.

These and other features and advantages of the present invention will become apparent from reading of the following description of preferred embodiments, given by way of example only, and with reference to the accompanying drawings, in which.

The same reference numerals are used throughout the Figures to denote the same, or similar, parts. It should be understood that the Figures are merely schematic and are not drawn to scale. In particular, certain dimensions have been exaggerated whilst others have been reduced.

It has been recognised by the inventor that the polycrystalline silicon (polysilicon) islands required for the thin film transistors (TFTs) can be formed before depositing the amorphous silicon required for the intrinsic region of a PIN diode stack. Therefore, the amorphous silicon is not subjected to the high temperatures required to form the polysilicon islands. It has been further recognised that the doped source and drain contact regions of the polysilicon TFTs can be employed to form at least one of the doped regions in an amorphous silicon photo sensor. By sharing a doped region in this way, the requirement to provide a separate doped region for the photo sensor is removed. Example structures in which at least one doped region is shared between a TFT and a photo sensor will now be described.

Figure 3:
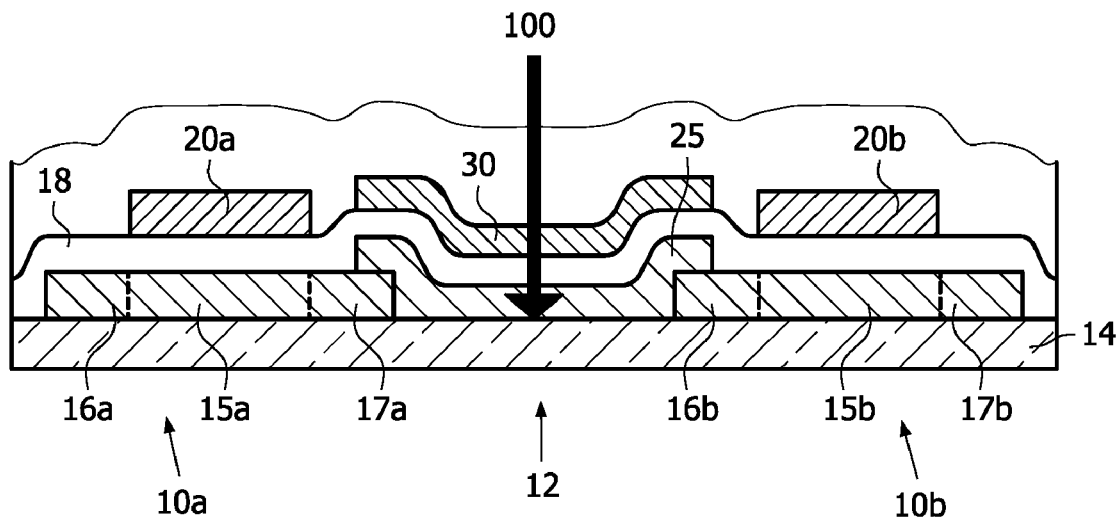
FIG. 3 is a sectional view through part of the pixel circuit having a photo sensor according to a first embodiment of the invention; and, FIGS. 4 and 5 are sectional views through part of a pixel circuit having a photo sensor according to a second embodiment of the invention at different stages of fabrication.

FIG. 3 shows two TFTs, 10a and 10b, disposed on a substrate 14 and each having a polysilicon channel region, 15a and 15b. The first TFT 10a has n-type doped source and drain regions, 16a and 17a. The second transistor 10b has p-type doped source and drain regions. The respective metallic source and drain contacts have not been shown here for simplicity.

The polysilicon island defining the channel, source and drain regions of each TFT is formed in a known manner. For example, a layer of amorphous silicon is deposited on the substrate and source and drain regions are then selectively doped by ion implantation. Following this the amorphous silicon layer is patterned into islands and then crystallised by laser annealing for example. It will be appreciated by the skilled person that there are variations on this method for forming the islands. For example, it is known to crystallise the silicon layer before the patterning step.

Figure 1:
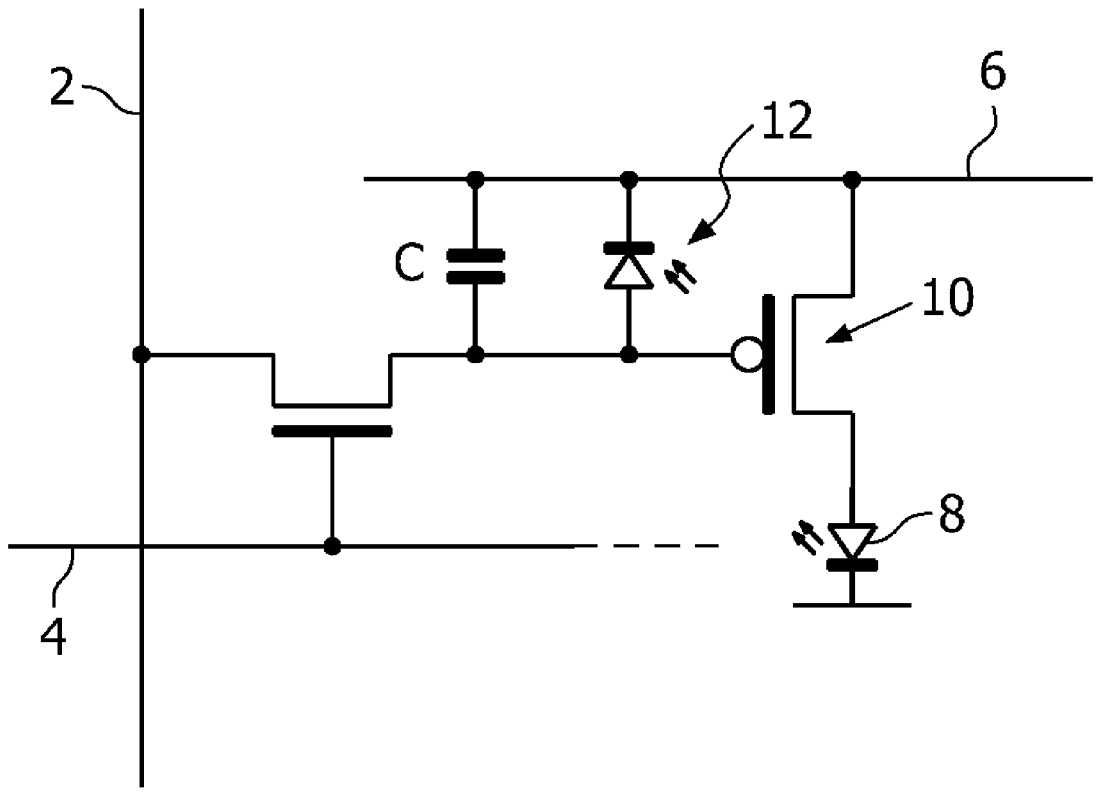
FIG. 1 shows a pixel circuit of an active matrix electroluminescent display device having a known arrangement of circuit components.
Figure 2:
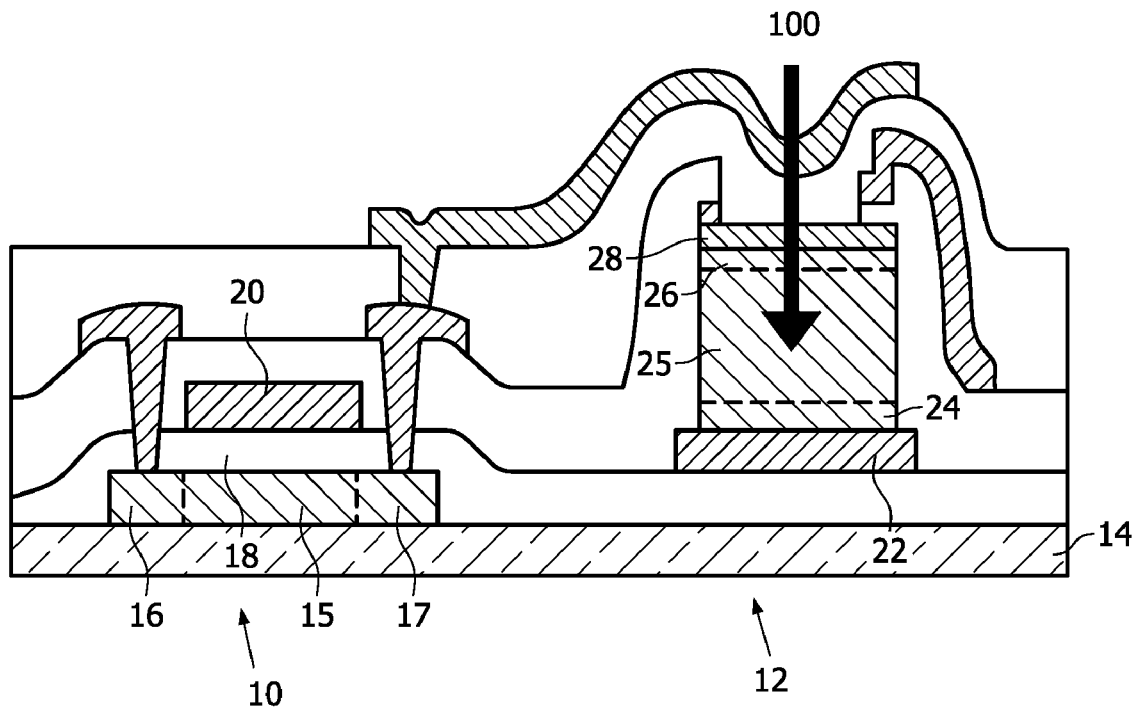
FIG. 2 is a sectional view through part of the pixel circuit shown in FIG. 1.

The active matrix array typically comprises many thousands of TFTs disposed on the substrate. However, only two are shown in FIG. 3 for simplicity. In accordance with a first embodiment of the invention, the n-type doped drain region 17a of one TFT 10a and the p-type doped source region 16b of an adjacent TFT are used to define also the doped contacts for an amorphous silicon photo sensor 12. Therefore, the separate doped regions for the photo sensors of FIG. 2 are not required. It will be appreciated that the adjacent TFTs employed for this purpose are of opposite conductivity types, i.e. one n-type and one p-type.

To provide the intrinsic region of the photo sensor 12, a layer of intrinsic amorphous silicon is deposited over the substrate and patterned into individual islands positioned between a respective pair of adjacent TFTs. Each island overlies and contacts a part of an n-type doped region of one TFT and a p-type doped region of the other.

Therefore, PIN diodes which can serve as photo sensors are defined on the substrate without the need for dedicated gas phase doping equipment. Advantageously, this method provides a simple, and therefore cheap, route to manufacturing active matrix electroluminescent display devices incorporating photo sensors.

The resulting arrangement of the method according to the first embodiment, as shown in FIG. 3, comprises a lateral PIN diode 12 which provides certain advantages over the vertical arrangement of FIG. 2 for example. Firstly, the vertical arrangement requires a relatively thick amorphous silicon layer, 0.25-1.50 μm for example, in order to ensure that the reverse leakage current is of a low enough value to allow effective operation of the device. Providing a layer having this thickness is relatively difficult and time consuming. In contrast, the distance between the doped contact regions of the photo sensor in FIG. 3 is equal to the gap between adjacent TFTs. In this case, the reverse leakage current can be maintained at an acceptably low level by using a thinner intrinsic layer. Advantageously, this intrinsic layer can be formed simply by deposition and patterning.

A gate insulator layer 18, for example of $SiO_2$, is then deposited over the substrate. A metal layer, of aluminium for example, is then deposited over the substrate and patterned to define a gate 20a, 20b, for each TFT. A transparent conductive gate 30 is then formed in a similar manner over the intrinsic region of the n-i-p diode. This serves, during operation, to apply a voltage to the diode so that it can control, to some extent, the conductivity between the doped contacts. For example, charge from an adjacent insulator can accumulate in the channel and affect the off-current. A biasing voltage applied to the gate 30 can advantageously minimise the off-current. The transparency of the gate is required to enable the light 100 from the display element to pass therethrough.

It will be appreciated that the gate 30 above the photo sensor is an optional feature which can be omitted if required without deviating from the advantages provided by the shared doped regions.

Figure 4:
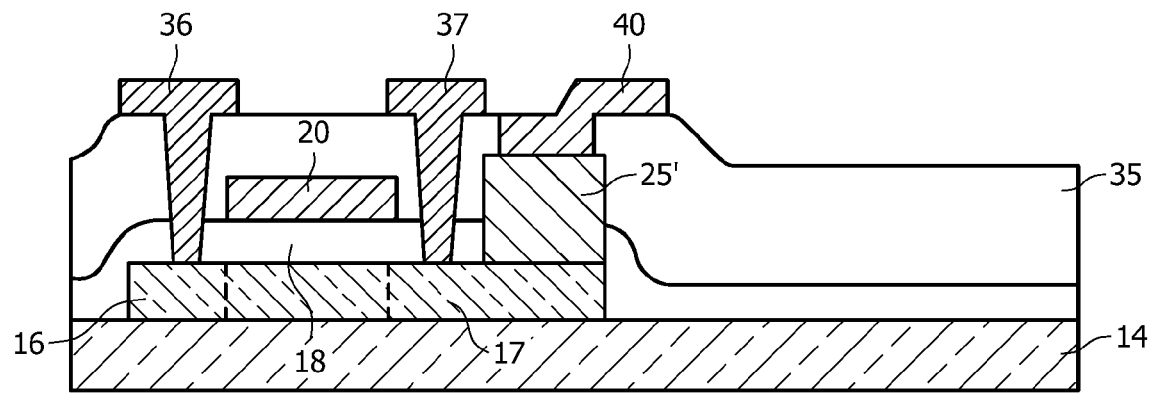
Figure 5:
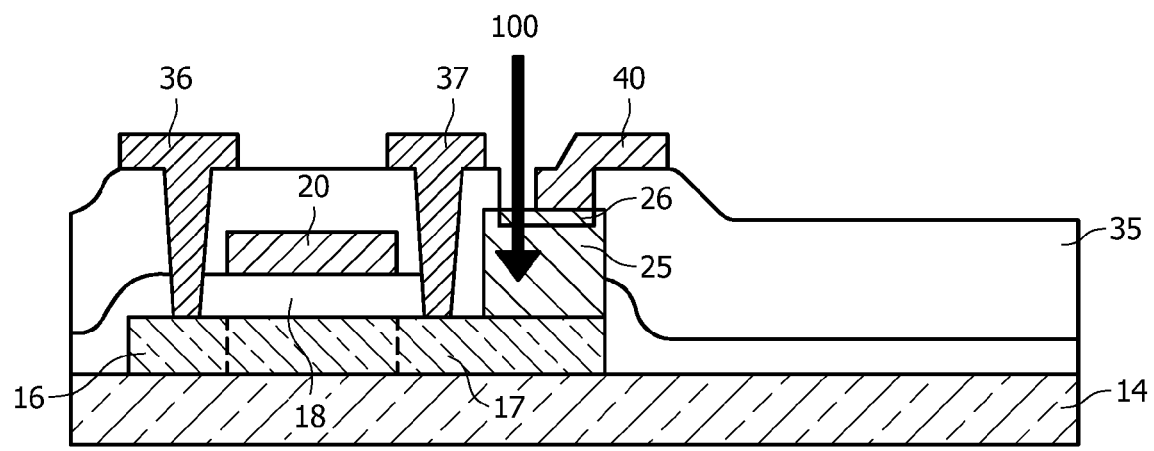

With reference to FIGS. 4 and 5, a vertical n-i-p stack can be provided by using a doped region of one polysilicon TFT for the n-type region. The p-type region is formed by depositing aluminium on the intrinsic amorphous silicon island and annealing so that the aluminium diffuses into the amorphous silicon thereby doping it p-type. The aluminium can then be patterned to reveal the underlying p-type region. Fabrication of a photo sensor according to this second embodiment will now be described.

In a similar manner to the above-described embodiment, a polysilicon island is formed on a substrate 14 by deposition, patterning and annealing of an amorphous silicon layer. n-type source and drain regions, 16,17, are defined by ion implantation prior to annealing the amorphous silicon. An insulating layer is then deposited over the substrate to provide the gate-insulating layer 18. A metallic gate electrode 20 is then formed over the channel 15. A passivation layer 35 is then deposited over the entire substrate. A contact window is then opened up in the passivation layer to expose the n-type drain region 17. A layer of intrinsic amorphous silicon is then deposited over the substrate and patterned to define an island 25' disposed on part of the n-type drain region 17, as shown in FIG. 4. This island provides the main body of the vertical photo sensor. Vias are formed in the passivation layer to allow contact with the underlying source and drain regions 16,17, of the TFT.

A layer of aluminium is then deposited and patterned to define source and drain contacts, 36,37, and a top photo sensor contact 40. It will be appreciated that an aluminium alloy can instead be used for this purpose. The top photo sensor contact 40 is then annealed by heating to 200° C. for 20 minutes for example. This annealing process causes aluminium ions to diffuse into the underlying intrinsic island 25', doping a region p-type. In addition, the annealing crystallises at least a portion of the doped p-type region which enhances the doping effect.

With reference to FIG. 5, part of the top surface of the p-type region 26 is thereafter exposed by etching away part of the aluminium top photo sensor contact 40. This allows exposure of the PIN stack to light 100 emitted from the overlying display element.

From this method, a highly effective p-type contact 26 can be formed without the use of gas phase dopants.

In a third embodiment of the invention (not shown) the amorphous silicon intrinsic region of the PIN diode overlies the gate electrode insulated therefrom by an insulating layer. This provides light shielding to the diode to prevent ambient light from the side of the substrate remote the TFT causing a photocurrent. Such an arrangement is particularly beneficial when employed in optical feedback circuits for electroluminescent displays as unwanted ambient light can result in an inaccurate measurement of the output light intensity from an associated display element.

It will be appreciated that the n-type and/or p-type doped contact for the PIN diode may be provided by a polysilicon island which does not form part of a TFT without deviating from the essence of the invention.

In summary, an active matrix pixel device is provided, for example an electroluminescent display device, the device comprising circuitry supported by a substrate and including a polysilicon TFT and an amorphous silicon thin film PIN diode. Polysilicon islands are formed before an amorphous silicon layer is deposited for the PIN diode. This avoids the exposure of the amorphous silicon to high temperature processing. The TFT comprises doped source/drain regions, one of which may also provide the n-type or p-type doped region for the diode. Advantageously, the requirement to provide a separate doped region for the photodiode is removed, thereby saving processing costs. A second TFT having a doped source/drain region of the opposite conductivity type may provide the other doped region for the diode, wherein the intrinsic region is disposed laterally between the two TFTs, overlying each of the respective polysilicon islands.

From the present disclosure, many other modifications and variations will be apparent to persons skilled in the art. Such modifications and variations may involve other features which are already known in the art and which may be used instead of or in addition to features already disclosed herein.

The invention claimed is:

1. A method of manufacturing an active matrix pixel device comprising a thin film transistor which includes a polycrystalline silicon channel and doped source/drain regions, and a PIN diode which includes a p-type doped region and an n-type doped region separated by an amorphous silicon intrinsic region, the method including:
   (a) - forming a plurality of polycrystalline silicon islands on a substrate, one of which providing a transistor channel, and source/drain regions; and then,
   (b) - depositing and patterning a layer of amorphous silicon to provide the amorphous silicon intrinsic region of the PIN diode such that the intrinsic region overlies and contacts at least a part of one of the polycrystalline silicon islands which provides one of the p-type or n-type doped regions.

2. A method according to claim 1, wherein the source/drain regions and said one of the p-type or n-type doped regions of the PIN diode are provided by the same polycrystalline silicon island.

3. A method according to claim 1, wherein the source/drain regions are doped n-type, and wherein the method further comprises:
   (c) - depositing and patterning a layer of aluminium to define a top PIN diode contact on the intrinsic region of the PIN diode;
   (d) - annealing the top PIN diode contact to cause aluminium ions to diffuse into the underlying intrinsic region to form the p-type doped region.

4. A method according to claim 3, further comprising:
   (e) - etching away part of the top PIN diode contact so as to expose the PIN diode to input light.

* * * * *